March 22, 1966 HARUO SHIKI 3,242,437

BROAD BAND AMPLITUDE LIMITER

Filed Aug. 23. 1961

*Inventor*
H. SHIKI
By Arthur M. Lieberman
Agent

United States Patent Office 3,242,437
Patented Mar. 22, 1966

3,242,437

BROAD BAND AMPLITUDE LIMITER

Haruo Shiki, Tokyo, Japan, assignor to Nippon Electric Company, Limited, Tokyo, Japan, a corporation of Japan Filed Aug. 23, 1961, Ser. No. 133,432
Claims priority, application Japan, Aug. 25, 1960, 35/36,188
2 Claims. (Cl. 330—135)

This invention relates to an improved broad band amplitude limiter, and especially to that of an intermediate frequency amplitude limiter utilized in a radio relay device using broad band frequency modulation. Such an amplitude limiter is described in the Proceedings of the Institution of Electrical Engineers, part III, vol. 99 (1952), pp. 256–274 (September), and the limiter itself is shown in FIG. 3(*b*) on p. 258.

In conventional amplitude limiters of this kind the so-called single tuning type construction has been used as shown in FIG. 1. Here it may be seen that amplitude limiting crystal diodes $X_1$ and $X_2$ together with their bias voltages E and —E and an inductance $L_p$ which cancels at the center frequency of the transmitted signal, the capacitance existing between the stages of the vacuum tube amplifiers, are connected in parallel.

In such a circuit, amplitude limitation or compression near the center frequency differs from that on either side and at the same time, the frequency characteristic of this compression varies in accordance with the fluctuations of the signal input level applied to the diodes. Thus, in the prior art circuit when the input frequency is almost equal to the center frequency of the limiter, the entire output current from vacuum tube $V_1$ will flow through the diodes $X_1$ and $X_2$. As a result, maximum amplitude limiting will occur because the phases of the output current to the tube $V_1$ and the input current to tube $V_2$ will coincide with each other. If the frequency of the input signal deviates from the center frequency, the linear reactance (capacitance) component inherent in the vacuum tubes will act as a shunt or bypass element for the amplitude limiting elements. Thus, the effectiveness of the amplitude limiting elements will decrease with increased deviations from the center frequency and a phase difference between the output current from tubes $V_1$ and $V_2$ will be produced. Moreover, since this phase difference is dependent on the input signal (because the equivalent resistive component of diodes $X_1$ and $X_2$ varies in response to current flowing therethrough). When the input frequency modulated signal contains level variations, the so-called AM–FM conversion will inevitably occur. This in turn substantially complicates the distortion produced in the output current of tube $V_2$.

In order to calibrate prior art amplitude limiters it was usual practice to monitor the amplitude characteristics thereof by means of a slow sweep generator which had a constant output level. However, calibration by this type monitoring was not always accurate because, frequently, comparatively good amplitude characteristics would be present even when the limiter was out of adjustment. Therefore, calibration using this type of monitoring was not acceptable in the mass production of amplitude limiters. This is especially true when close adjustment of tolerances of time delay characteristics were required. As a result, very high class (costly) calibrating instruments, such as delay distortion measuring sets were required during mass production of prior art limiters.

The object of this invention is to remove the above disadvantages as much as possible and provides a circuit: which has a constant compression in the signal band regardless of the input signal level; which has constant transmission frequency characteristics; which has little diversity of delay distortion, thereby providing a broad band amplitude limiter wherein higher harmonics produced by the non-symmetry of the non-linear elements of the amplitude limiter are decreased; and which can easily be adjusted with a conventional sweep generator.

The above mentioned and other features and objects of this invention and the manner of attaining them will become more apparent and the invention itself will best be understood by reference to the following description of an embodiment of the invention taken in conjunction with the accompanying drawings wherein.

Figure 2:
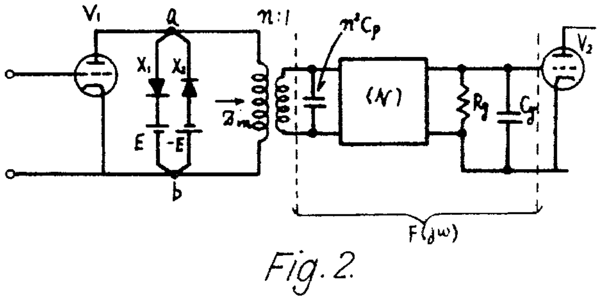
FIG. 2 shows a broad band amplitude limiter according to this invention.

In FIG. 2 which shows the principles of this invention for high-frequency, amplitude limiting non-linear elements $X_1$ and $X_2$ together with their bias voltages E and —E are connected as shown, to the output of a vacuum tube $V_1$ in parallel with the output capacity $C_p$ of the vacuum tube (shown as $n^2C_p$ on the secondary side of an ideal transformer), which may be increased if necessary, by adding an additional capacitor. Also, a terminating resistance $R_g$, which will be explained hereunder, is connected to the input of a vacuum tube $V_2$ in the second stage in parallel to the input capacity $C_g$ thereof.

Between the output circuit of the vacuum tube $V_1$ and the input circuit of the vacuum tube $V_2$ in the next stage the following are connected in cascade; an ideal transformer of $n$: 1 turn ratio, a capacitor $n^2C_p$ which is equivalent to $C_p$ reflected to the right-hand side of the ideal transformer, and a network (N) whose transmission characteristic the equivalent capacitor $n^2C_p$ and the terminating $R_g$ and $C_g$ is $F(j\omega)$.

The network N is composed of pure reactances and the transmission characteristic or, in simpler cases the transfer function $F(j\omega)$ which are connected to provide the Wagner type characteristic which is given by $$|F(j\omega)|=\frac{H}{\sqrt{1+\alpha\left(\frac{\omega}{\omega_0}-\frac{\omega_0}{\omega}\right)^{2m}}}$$

where H and $\alpha$ are constants, each of which is independent of the frequency of the signal being transmitted; $m$ is an integer representing the number of tuning circuits and in the case being considered, should be two or more to exclude the pure resistive load ($m=0$) and the single tuning arrangement ($m=1$); and $\omega_0$ represents the center angular frequency of the signal under transmission through the circuit (N) or filter, or the circuit ranging from the output side of the ideal transformer to the terminating resistance and the input capacity $R_g$ and $C_g$ inclusive. The constant H determines the absolute magnitude of the transmission characteristic and may be approximately unity. The other constant $\alpha$ relates to the width of the pass band of the filter; for a particular angular frequency $\omega_1$ at which the output voltage of the filter is desired to be lowered by 3 db, the constant $\alpha$ is given by $$\alpha\left(\frac{\omega_1}{\omega_0}-\frac{\omega_0}{\omega_1}\right)^{2m}=1$$

because for this value of the constant $$|F(j\omega_1)|=(1\sqrt{2})\cdot F(j\omega_0)$$

holds. On the other hand, the ideal Wagner or Butterworth characteristics $F_0(j\omega)$ of a signal transmission circuit is given, as is described in "Reference Data for Radio Engineer," published by International Telephone and Telegraph Corporation, 4th edition, p. 191, and is well-known, by $$|F_0(j^{\omega})| = \frac{H}{\sqrt{1+\beta(\omega-\omega_0)^{2m}}}$$

where $\beta$ is a constant which is independent of the frequency of the signal being transmitted. Inasmuch as the necessary frequency bandwidth of the circuit (N), although broad, is generally of such a small value that the fractional bandwidth is not larger than unity, the former characteristic $F(j\omega)$ is in good approximation to the latter characteristic $F_0(j\omega)$.

In such a network, the input impedance $Z_{in}$, when the external circuit is seen from the terminals $a$ and $b$ of the group of non-linear circuit elements, is $\cong n^2R_g$ in the pass band of network (N), and it is possible to obtain a relation $E_{ab}/E_{R_g} \cong n$ in the pass band (where $E_{ab}$ is the terminal voltage across $a$ and $b$ and $E_{R_g}$, the voltage across $R_g$). Thus, it is also possible to flatten the signal transmission characteristic in the pass band. In other words, the input impedance $Z_{in}$ for the pass band of the limiters of this invention is so controlled that even should the impedance of diodes $X_1$ and $X_2$ decrease, with an increase in the input power level (which can be represented by an equivalent resistor connected in shunt with the input impedance to the filter circuit (N)) the frequency characteristic of the phase shift will undergo substantially no change or fluctuation even when the current flowing into current circuit (N) changes. Since sufficient attenuation for harmonic signals higher than twice the transmission signal frequency can be produced by increasing the exponent $m$ of the Wagner characteristics, distortions of the fundamental frequency wave (resulting from second order non-linearities of the succeeding stage and produced during the recomposition of the second harmonic) can be decreased. However, a large $m$ complicates the circuit, and so $m$ is preferably around three.

Figure 1:
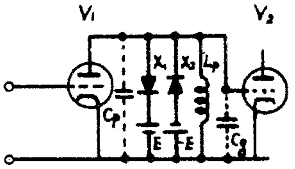
Fig. 1. PRIOR ART
FIG. 1 illustrates a conventional broad band amplitude limiter.
Figure 3:
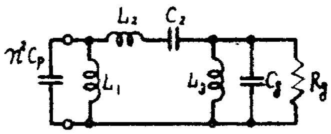
FIG. 3 shows in detail the cascade network of FIG. 2 in which $m$ is 3.

FIG. 3 shows a case in which $m$ in the transmission function $F(j\omega)$ of the connected network is three. It is to be noted here that what is illustrated in FIG. 3 is a network to be substituted for that network shown in FIG. 2 which is bounded by a pair of dotted lines or for, together with an ideal transformer (which is not shown in FIG. 3), the inductance $L_p$ and the capacities $C_p$ and $C_g$ shown in FIG. 1. It should be understood that the ideal transformer is an ideal equivalent transformer.

Let $Q=\omega_0 C_g R_g$ then the following relations are sufficient:

$$L_1 n^2 C_p = L_2 \cdot C_2 = L_3 \cdot C_g = 1/\omega_0^2$$
$$n^2 C_p = C_g$$
$$C_2 = C_g/2Q^2$$

Where, the first relation shows that all the tuning groups are in synchronous tuning or tuned to the same frequency, and the second relation $n^2C_p=C_g$ shows that the coupling filter circuit is symmetrical. If it is not required, however, to obtain the best input impedance $Z_{in}$, in an extreme case, or in case $n^2C_p \ll C_g$, the condition for a flat signal transmission is $C_2=C_g/Q^2$. Even in this case, however, the input impedance characteristics are much improved compared to the single tuning type limiter.

Figure 4:
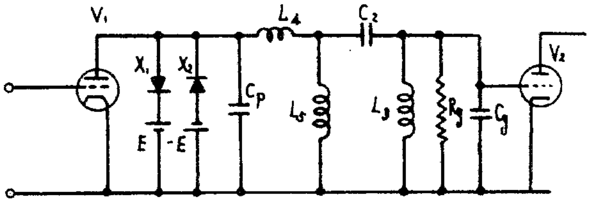
FIG. 4 illustrates an embodiment wherein the ideal transformer and the cascade network of FIG. 3 are combined.

FIG. 4 shows an embodiment wherein the ideal transformer and the cascade network of FIG. 3 are combined. Here the connection of $L_4$ and $L_5$ shows a construction of a minimum number of coils when the ideal equivalent transformer of FIG. 2 and coils $L_1$ and $L_2$ of FIG. 3 are combined.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. An improved broad band amplitude limiter particularly for frequency modulation signals, said limiter exhibiting substantially constant transfer characteristics in the pass band thereof despite variations in input signals supplied thereto, said amplitude limiter including first and second amplifying stages and non-linear amplitude limiting elements connected between said stages, the improvement comprising:

(A) a network having at least two inductive elements connected between said limiting elements and the input to said second amplifying stage, said network including:

(1) a first reactive tuning circuit, (2) first and second reactive elements in addition to the components forming said first tuning circuit, (3) a resistive termination, (4) two of the inductive elements of said network being connected to provide an ideal transformer;

(B) the output capacitance of said first stage and said first reactive element being connected to provide a second, input tuning circuit;

(C) the input capacitance of said second amplifier stage and said second reactive element being connected to form a third, output, tuning circuit; and (D) said first, second and third tuning circuits being tuned such that the voltage drop across said non-linear amplitude limiting elements divided by the voltage drop across said resistive termination is substantially equal to a constant throughout the pass band of said limiter.

2. A broad band amplitude limiter as claimed in claim 1 in which the ideal transformer and said network are combined.

References Cited by the Examiner

UNITED STATES PATENTS

| | | | |
|---|---|---|---|
| 1,691,147 | 11/1928 | Clark | 333—14 |
| 2,221,681 | 11/1940 | Schlegel | 333—14 |
| 2,284,444 | 5/1942 | Peterson | 329—134 |
| 2,520,480 | 8/1950 | Tellier | 329—134 |
| 2,576,833 | 11/1951 | Goodall | 329—134 |
| 2,861,185 | 11/1958 | Hopper | 329—134 |
| 2,930,005 | 3/1960 | Tautner | 333—70 |
| 2,951,937 | 9/1960 | Janssen et al. | 329—134 |
| 3,024,313 | 3/1962 | Ensink et al. | 333—14 |

FOREIGN PATENTS 475,446 11/1937 Great Britain.

OTHER REFERENCES

Bell System Tech. Journal, Rutheroff, "Amplitude Modulation," July 1958, pp. 1029–36.

HERMAN KARL SAALBACH, *Primary Examiner.*